US011605745B2

(12) United States Patent
Strobl

(10) Patent No.: US 11,605,745 B2
(45) Date of Patent: Mar. 14, 2023

(54) STACKED III-V SEMICONDUCTOR PHOTONIC DEVICE

(71) Applicant: AZUR SPACE Solar Power GmbH, Heilbronn (DE)

(72) Inventor: Gerhard Strobl, Stuttgart (DE)

(73) Assignee: AZUR SPACE Solar Power GmbH, Heilbronn (DE)

(*) Notice: Subject to any disclaimer, the term of this patent is extended or adjusted under 35 U.S.C. 154(b) by 6 days.

(21) Appl. No.: 17/209,147

(22) Filed: Mar. 22, 2021

(65) Prior Publication Data
US 2021/0296515 A1    Sep. 23, 2021

(30) Foreign Application Priority Data
Mar. 20, 2020 (DE) .................... 10 2020 001 842.4

(51) Int. Cl.
*H01L 31/0304* (2006.01)
*H01L 31/0336* (2006.01)
*H01L 31/118* (2006.01)

(52) U.S. Cl.
CPC .... *H01L 31/03042* (2013.01); *H01L 31/0336* (2013.01); *H01L 31/03046* (2013.01); *H01L 31/118* (2013.01)

(58) Field of Classification Search
CPC ......... H01L 31/03042; H01L 31/03046; H01L 31/0336; H01L 31/118

(Continued)

(56) References Cited

U.S. PATENT DOCUMENTS 6,034,321 A * 3/2000 Jenkins ........... H01L 31/022433
                                                         438/57
6,998,320 B2    2/2006 Krueger et al.
(Continued)

FOREIGN PATENT DOCUMENTS

DE          60221638 T2     5/2008
DE      102016013540 A1     5/2018
(Continued)

OTHER PUBLICATIONS

Jeffrey Barton et al: "InGaAs NIR focal plane arrays for imaging and DWDM applications" Infared Detectors and Focal Plane Arrays VII, Proceedings of SPIE vol. 4721, 2002, pp. 37-47.
G.H. Olsen et al: "Multiplexed 256 Element InGaAs Detector Arrays for 0.8-1.7 um Room-Temperature Operation", Infared Technology XIV, SPIE vol. 972, pp. 279-285, 1988.
(Continued)

*Primary Examiner* — Calvin Y Choi
(74) *Attorney, Agent, or Firm* — Muncy, Geissler, Olds & Lowe , P.C.

(57) ABSTRACT

A stacked III-V semiconductor photonic device having a second metallic terminal contact layer at least formed in regions, a highly doped first semiconductor contact region of a first conductivity type, a very low doped absorption region of the first or second conductivity type having a layer thickness of 20 μm-2000 μm, a first metallic terminal contact layer, wherein the first semiconductor contact region extends into the absorption region in a trough shape, the second metallic terminal contact layer is integrally bonded to the first semiconductor contact region and the first metallic terminal contact layer is arranged below the absorption region. In addition, the stacked III-V semiconductor photonic device has a doped III-V semiconductor passivation layer of the first or second conductivity type, wherein the (Continued)

III-V semiconductor passivation layer is arranged at a first distance of at least 10 μm to the first semiconductor contact region.

25 Claims, 3 Drawing Sheets

(58) Field of Classification Search
 USPC .......................................................... 257/79
 See application file for complete search history.

(56) References Cited

U.S. PATENT DOCUMENTS

| | | | |
|---|---|---|---|
| 7,217,324 | B2 | 5/2007 | Bourgoin |
| 10,074,540 | B2 | 9/2018 | Dudek |
| 10,192,745 | B2 | 1/2019 | Dudek |
| 10,263,124 | B2 | 4/2019 | Dudek |
| 10,312,381 | B2* | 6/2019 | Dudek .................. H01L 29/872 |
| 10,340,394 | B2 | 7/2019 | Dudek |
| 10,734,532 | B2 | 8/2020 | Dudek |
| 2007/0278626 | A1* | 12/2007 | Fuchs .................. H01L 31/1868 257/E29.329 |
| 2010/0213513 | A1 | 8/2010 | Zampardi et al. |
| 2022/0037547 | A1* | 2/2022 | Ben Slimane ...... H01L 31/0735 |

FOREIGN PATENT DOCUMENTS

| | | |
|---|---|---|
| DE | 102016013541 A1 | 5/2018 |
| DE | 102016015056 A1 | 6/2018 |
| DE | 102017002935 A1 | 9/2018 |
| DE | 102017002936 A1 | 9/2018 |
| WO | WO2004081604 A2 | 9/2004 |

OTHER PUBLICATIONS

Anne Rouvie et al: "InGaAs focal plane arrays developments at III-VLab" Infared Technology and Applications XXXVIII, Proc of SPIE vol. 8353, 835308, 2012, DOI: 10.1117/12.921134.

Henry Yuan et al: "FPA Development: from InGaAs, InSb, to HgCdTe" Infared Technology and Applications XXXIV, Proc. of SPIE vol. 6940, 694030, 2008, DOI: 1117/12.782735.

G.C. Sun et al: "A method for adjusting the performances of epitaxial GaAs X-ray detectors" Nuclear Instruments & Methods in Physics Research, Section A, 2002, vol. 487, pp. 50-53.

J. C. Bourgoin et al: "GaAs Schottky versus p/i/n diodes for pixellated X-ray detectors" Nuclear Instruments & Methods in Physics Research, Section A, vol. 487, 2002, pp. 47-49.

G. M. Lezhneva et al: "GaAs Pixel-Detector Technology for X-ray Medical Imaging: A Review" Russian Microelectronics, vol. 34, No. 4, 2005, pp. 229-241.

Maria Rizzi et al: "GaAs X-Ray System Detectors for Medical Applications" https://www.researchgate.net/publication/237780321.

German Ashkinazi: "GaAs Power Devices", pp. 8-9, ISBN: 965-7094-19-4.

Youngmoon Choi et al: "Interdigitated front contact crystalline silicon solar cell", Solar Energy, vol. 100, 2014, pp. 94-101.

* cited by examiner

STACKED III-V SEMICONDUCTOR PHOTONIC DEVICE

This nonprovisional application claims priority under 35 U.S.C. § 119(a) to German Patent Application No. 10 2020 001 842.4, which was filed in Germany on Mar. 20, 2020 and which is herein incorporated by reference.

BACKGROUND OF THE INVENTION

Field of the Invention

The present invention relates to a stacked III-V semiconductor photonic device.

Description of the Background Art

III-V semiconductor diodes are now used in a wide variety of applications, each with adapted parameters.

From "GaAs Power Devices" by German Ashkinazi, ISBN 965-7094-19-4, pp. 8 and 9, a high-voltage-resistant semiconductor device made of GaAs with p+-n-n+ is known.

Further high-voltage III-V semiconductor devices and corresponding manufacturing methods are also described in the publications DE 10 2016 013 540 A1 (which corresponds to U.S. Pat. No. 10,263,124), DE 10 2016 013 541 A1 (which corresponds to U.S. Pat. No. 10,074,540), DE 10 2016 015 056 A1 (which corresponds to U.S. Pat. No. 10,192,745), DE 10 2017 002 935 A1 (which corresponds to U.S. Pat. No. 10,312,381) and DE 10 2017 002 936 A1 (which corresponds to U.S. Pat. No. 10,340,394), and which are all herein incorporated by reference.

III-V semiconductor devices are also used as pixels or semiconductor detectors in 2D pixel array detectors.

For example, infrared detectors are known from "InGaAs NIR focal plane arrays for imaging and DWDM applications", Barton et al, Infrared Detectors and Focal Plane Arrays VII, Proc. of SPIE Vol. 4721, 2002.

The described III-V semiconductor diode structures each feature a lattice-matched InGaAs absorption region on an n+ doped InP substrate, a diffusion-generated p+ contact region, and a III-V semiconductor passivation layer. Corresponding infrared detectors are also known from "Multiplexed 256 Element InGaAs Detector Arrays for 0.8-1.7 um Room-Temperature Operation", Olsen et al., Infrared Technology XIV, SPIE Vol. 972, 279 and from "InGaAs focal plane arrays developments at III-VLab", Rouvie et al., Infrared Technology and Applications XXXVIII, Proc. of SPIE Vol. 8358, 835308, 2012, doi: 10.1117/12.921134.

Also from "FPA Development from InGaAs InSb to HgCdTe", Yuan et al, Infrared Technology and Applications XXXIV, Proc. of SPIE Vol. 6940, 69403C, 2008, doi: 10.1117/12.782735, an infrared detector is known, wherein different p-i-n structures with InGaAs having different indium content are described as an absorption region on an InP substrate, optionally with a buffer layer, as well as pixel arrays based on InSb and HgCdTe.

From "A Method for Adjusting the Performance of Epitaxial GaAs X-ray Detectors", Sun, G. C. and Bourgoin, J. C., Nucl. Instrum. Methods Phys. Res., Sect. A, 2003, vol. 512, pp. 355-360, from "GaAs Schottky versus p/i/n Diodes for Pixellated X-ray Detectors", Bourgoin, J. C. and Sun, G. C., Nucl. Instrum. Methods Phys. Res., Sect. A, 2002, vol. 487, pp. 47-49, also from DE 602 21 638 T2, a method and apparatus for manufacturing a GaAs detector for X-ray detection and image acquisition is known. Furthermore, another GaAs image acquisition device for the detection of X-rays is known from WO 2004 816 04 A2.

P-i-n structures made of a GaAs compound are known as pixels of an X-ray detector from "GaAs Pixel-Detector Technology for X-ray Medical Imaging", Lezhneva et al, a Russian Microelectronics, Vol. 34, No. 4, 2005, pp. 229-241, wherein both epitaxially grown and implanted p+ contact regions are disclosed. Alternatively, GaAs-based Schottky diodes are disclosed.

A GaAs-based X-ray detector, also based on Schottky diodes, is known from "GaAs X-Ray System Detectors for Medical Applications", Rizzi et al, https://www.researchgate.net/publication/237780321.

A disadvantage of the described structures are the residual or leakage currents that occur during reverse-bias mode especially across the edges of the planar p-n junctions or the mesa structures.

SUMMARY OF THE INVENTION

It is therefore an object of the present invention to provide a device which improves on the prior art. In particular, the aim is to reduce reverse leakage currents and increase the breakdown voltage.

In an exemplary embodiment of the invention, a stacked III-V semiconductor photonic device is provided.

The stacked III-V semiconductor photonic device can have a second metallic terminal contact layer formed at least in regions, a highly doped first semiconductor contact region, an absorption region, and a first metallic terminal contact layer.

The first semiconductor contact region can be of a first conductivity type with a dopant concentration of at least $5 \cdot 10^{18}$ cm$^{-3}$, a first lattice constant and a first energy bandgap.

The absorption region is of a second conductivity type or of the first conductivity type, wherein a dopant concentration in the absorption region is between $8 \cdot 10^{11}$ and $5 \cdot 10^{14}$ cm$^{-3}$. Preferably, the absorption region has a uniform dopant concentration. In another embodiment, the dopant concentration varies across the thickness of the absorption region.

The absorption region has the first lattice constant and a layer thickness in a range between 80 μm and 2000 μm, preferably from 100 μm to 2000 μm or from 500 μm to 2000 μm or from 1000 μm to 2000 μm.

The first semiconductor contact region can be trough-shaped with a top side and a depth extending into the absorption region. Preferably, the top side of the first semiconductor contact region is completely surrounded by a top side of the absorption region.

The bottom side of the second metallic terminal contact layer can be integrally bonded to the top side of the first semiconductor contact region.

The first metallic terminal contact layer can be arranged below a bottom side of the absorption region.

The stacked III-V semiconductor photonic device further comprises a III-V semiconductor passivation layer having the first lattice constant and a second energy bandgap which differs from the first energy bandgap, wherein the III-V semiconductor passivation layer includes the first or the second conductivity type and a dopant concentration in a range between $1 \cdot 10^{14}$ cm$^{-3}$ and $5 \cdot 10^{18}$ cm$^{-3}$.

The III-V semiconductor passivation layer can be arranged at a first distance of at least 10 μm or of at least 20 μm or of at least 40 μm from the top side of the first semiconductor contact region on the top side of the absorption region and is integrally bonded to the top side of the absorption region.

Preferably, the first distance is a maximum of 40 µm or a maximum of 80 µm or a maximum of 150 µm or a maximum of 1500 µm or a maximum of 2000 µm.

It should be noted that the metallic terminal contact layers each have very good electrical conductivity. Preferably, the metallic terminal contact layers are formed of one or more metal layers, wherein the metal layers preferably comprise Ge and/or Au and/or Pd and/or Ag.

The metallic terminal contact layers establish an electrically low-impedance contact to the highly doped first semiconductor contact region and to another doped semiconductor contact region, e.g. a highly doped second semiconductor contact layer or the very low doped absorption region. It is understood that the respective semiconductor layer is in each case directly connected to the corresponding metallic terminal contact layer, i.e. it is integrally bonded to it.

It is further understood that the terminal contact layers can be interconnected by means of bonding wires with contact fingers, so-called pins, and/or by means of contact points, so-called bumps, with flip-chip mounting, in that preferably multiple or a plurality of photonic devices are arranged on a carrier, for example in the form of a lead frame. In one embodiment, the photonic devices are arranged in a matrix.

The first semiconductor contact region can be formed as a region extending into the absorption region, so that the top side of the first semiconductor contact region and the top side of the absorption region form a common surface, or the top side of the first semiconductor contact region is located in an island shape within the top side of the absorption region.

However, it is understood that the first semiconductor contact region is always spaced from the III-V semiconductor passivation layer by a surface formed by the absorption region. In other words, the III-V semiconductor passivation layer is always spaced from the edge of the first semiconductor contact region by at least 10 µm. The maximum distance is as great as the thickness of the absorption region.

The first semiconductor contact region extends from the top side to a maximum depth into the absorption region, wherein the layer thickness of the absorption region is significantly greater than the depth of the first semiconductor contact region.

Preferably, at an edge of the III-V semiconductor passivation layer formed in the direction of the first semiconductor contact region, the otherwise planar surface of the absorption region can have a circumferential step formed along the edge.

The first semiconductor contact region can be preferably created by implantation or diffusion. The other semiconductor regions or semiconductor layers, e.g. the absorption region and/or the III-V semiconductor passivation layer, are preferably produced partially or completely epitaxially, e.g. by means of MOVPE or by means of CSVT (Closed Space Vapor Transport) or by means of LPE.

For example, a GaAs substrate or a Ge substrate is used as the growth substrate. In the case of the GaAs substrate, active layers of GaAs can be deposited directly on the substrate. In the case of the Ge substrate, an InGaAs interlayer with an In content of approx. 1% is required for the growth of GaAs layers, in order to achieve a lattice constant difference between the Ge substrate and the GaAs epitaxial layer.

The growth substrate is then preferably completely, if necessary also only partially, removed by grinding and/or etching and/or other processes, e.g. detaching.

In an example, an etch stop layer is inserted below the absorption region for this purpose during a manufacturing process of the stacked III-V semiconductor device. The etch stop layer is produced, for example, between the absorption region and a buffer layer or a substrate layer, or between a second semiconductor contact layer and a buffer layer or a substrate layer, or between a buffer layer and a substrate layer.

The etch stop layer allows for subsequent removal of the substrate layer and the buffer layer or of only the substrate layer by means of an etching process, e.g. wet chemical etching. In particular, the etch stop layer enables the substrate and/or buffer layer to be removed without a mechanical grinding process or to combine a mechanical grinding process with an etching step, e.g. most of the substrate is removed by grinding and only the remaining part is removed by chemical etching.

The etch stop layer itself can also be removed afterwards. The etch stop layer exhibits a strong chemical anisotropy as compared to the adjacent layers, i.e. the etch rate for the etch stop layer and the adjacent layer differ by at least a factor of 10.

The etch stop layer usually consists of or is formed of GaInP or AlGaAs, and the surrounding layers of GaAs or GaInAs. The removed layers are no longer present in the final device.

The semiconductor layers of the device, for example made of GaAs, are produced epitaxially. Later, for example, first the Ge-substrate is removed by means of a grinding and/or etching process and, if necessary, a buffer layer is then removed from the GaAs photonic device by means of a further etching process, e.g. wet chemical etching.

As an alternative to the complete removal of the growth substrate, the growth substrate, e.g. a GaAs substrate doped with the second conductivity type, is only partially removed so that a remaining, e.g. thin to very thin, layer forms a highly doped second semiconductor contact layer of the second conductivity type.

Alternatively or complementarily, one or more layers of the stacked III-V semiconductor photonic device are bonded together by means of a wafer bond.

It should also be noted that the term "semiconductor layer" can be used synonymously with the term "semiconductor region". However, the term "semiconductor region" is used to refer to a generally trough-shaped formation of the intermediate region, and the term "semiconductor layer" commonly refers to a layer having at least a planar bottom side and/or a planar top side.

Preferably, the III-V semiconductor layers are each at least partially planar or partially trough-shaped with respect to one another, wherein the lateral formation of the respective III-V semiconductor layers for the planar arrangement is preferably the same size.

It is understood that only the semiconductor regions or semiconductor layers or at least a major part of the semiconductor regions or semiconductor layers of the III-V photonic device consist of or is formed of III-V materials, e.g. GaAs, AlGaAs, InGaP, GaAsP, InGaAs or InP. The III-V semiconductor photonic device may thus additionally comprise semiconductor layers of other semiconductor materials, or additional layers of other non-semiconductor materials.

Furthermore, it is understood that a semiconductor region or semiconductor layer consisting of a III-V material must only substantially consist of III-V material or, in addition to a III-V material, i.e. a material which contains one or more elements of the main groups III and/or V, may still contain contaminants, impurities and/or dopants.

The same applies to a semiconductor region, or a semiconductor layer, made of GaAs or another expressly named material combination. If a layer has an expressly named material combination, this means that the material of the layer essentially consists of a combination of the expressly named materials and optionally other elements of main groups III and/or V. A layer comprising GaAs can thus, for example, be an InGaAs layer.

Low doped thick layers, such as the absorption layer according to the invention, can now be deposited using MOVPE, for example, which makes it easy to produce layer stacks. The lower the doping level of the layer, the lower the reverse voltage required to build up the largest possible electric field. As a follow up, the layers can also be irradiated by electrons with e.g. 1 MeV in order to generate EL2 recombination centers uniformly over the entire layer thickness, which then lower the doping level of the thick layer even further in a very defined way by trapping an electron or a hole.

It is also understood that the III-V semiconductor photonic device may be formed with an n-on-p or a p-on-n structure. Correspondingly, either the first conductivity type is n and the second conductivity type p, or vice versa.

If the semiconductor device does not have an additional second semiconductor contact layer, the conductivity type of the absorption region differs from the conductivity type of the first semiconductor contact region, i.e. the absorption region is of the second conductivity type and the p-n junction is formed between the first semiconductor contact region and the absorption region.

If the semiconductor device has a second semiconductor contact layer, the p-n junction may be formed either between the absorption region and the first semiconductor contact region or between the absorption region and the second semiconductor contact layer, wherein the absorption region is of either the second or the first conductivity type, respectively.

If necessary, thanks to the local p-n junction between the first semiconductor contact region and the absorption layer and in particular thanks to the III-V semiconductor passivation layer, leakage currents in the edge region or in the current path running over the edge are suppressed.

Studies have shown that the breakdown voltage is not only determined by the thickness of the absorption region but also significantly by the first distance between the III-V semiconductor passivation layer and the first semiconductor contact region.

With the photonic device according to the invention, breakdown field strengths of up to 40 V/µm and very reliable breakdown field strengths of up to 50 V/µm can be achieved.

III-V semiconductors, in particular GaAs, provide a particularly high electron mobility of 8800 Vs/cm at a doping of less than $1 \cdot 10^{15}$ cm$^3$, wherein the electron mobility for InGaAs of about 12,000 Vs/cm is at a doping of less than $1 \cdot 10^{15}$ cm$^{-3}$.

Advantages of the semiconductor structure according to the invention are a particularly low reverse leakage current and a high breakdown voltage. In particular, the breakdown characteristic exhibits an ideal curve.

With the particularly thick absorption region above 80 µm, up to a thickness of 2000 µm or a thickness between 100 µm and 2000 µm, and the particularly high reverse voltage, the semiconductor structure according to the invention is particularly suitable as a pixel for radiation detection, in particular for the detection of X-rays. In other words, the photonic component is particularly suitable as an X-ray detector.

By providing a gap between the III-V semiconductor passivation layer and the first semiconductor contact region, particularly low reverse leakage currents of less than 1 µA occur even at high reverse voltages above 400 V. In particular, the reverse leakage currents are in a range between 0.5 nA and 50 nA or below 100 nA.

This allows for high reverse voltages to be applied in order to drift the charge carriers produced by the absorption in the direction of the p-n transition. It is understood that this allows for a very high sensitivity of the detector to be achieved.

The particularly thin first metallic connection layer is preferably not flat but finger-shaped or strip-shaped or dot-shaped. By means of a thin second semiconductor contact layer or by omitting the second semiconductor contact layer, the permeability for photons, for example X-rays, is increased. This allows for the semiconductor photonic device according to the invention to be used, in particular, as a pixel of a pixel array X-ray detector. Preferably, the first metallic terminal layer has a thickness less than 100 µm and greater than 0.1 nm.

It is also understood that the photonic device can be aligned for the detection of rays so that these impinge on the first metallic terminal contact layer and the bottom side of the device. The terms "bottom" and "top" or "below" and "above" are used only to refer to the arrangement of the individual layers and regions relative to each other and do not give an absolute direction.

In an example, the III-V semiconductor passivation layer has a layer thickness of 0.1 µm-10 µm. Preferably, the III-V semiconductor passivation layer has a higher bandgap than the absorption region lying below. In particular, the III-V semiconductor passivation layer comprises, for example, a compound of InGaP and/or AlGaAs and/or InGaAsP, or consists of AlGaAs or of InGaP or of InGaAsP. In another further development, further passivation layers, in particular formed from silicon nitride and/or silicon oxide, are also formed on the III-V semiconductor passivation layer.

In another example, the first distance of the III-V semiconductor passivation layer to the first semiconductor contact region is at least 50% or at least 75% of the layer thickness of the absorption region.

It is understood that the first distance depends on the reverse voltage. The greater the reverse voltage, the greater the first distance must be. This results in a corresponding relationship between the distance and the layer thickness of the absorption region.

In another example, in a projection perpendicular to the top side of the first semiconductor contact region, the III-V semiconductor passivation layer fully encloses the first semiconductor contact region.

Thus, the III-V semiconductor passivation layer has a through hole in the projection, and the first semiconductor contact region is arranged within the through hole such that a distance of an edge of the first semiconductor contact region to an edge of the through hole is always greater than, or equal to, the first distance.

In an example, the III-V semiconductor passivation layer is of the same conductivity type as the absorption region. The III-V semiconductor passivation layer and the absorption region are thus either both p-doped, or both n-doped.

Alternatively, the III-V semiconductor passivation layer has a layer that is separated from the absorption region, wherein the III-V semiconductor passivation layer is integrally bonded to a third metallic terminal contact layer formed at least in regions.

In particular, the absorption region is of the first conductivity type and the III-V semiconductor passivation layer is of the second conductivity type and the third metallic terminal contact layer is integrally bonded to the top side of the III-V semiconductor passivation layer.

In example, the III-V semiconductor passivation layer is epitaxially arranged on the absorption region and the absorption region is epitaxially arranged on a semiconductor contact layer or on a buffer layer or on a substrate layer.

In another further development, the first metallic terminal contact layer has a layer thickness of 5 nm-2 µm or 10 nm-1 µm. Since only very low currents of less than half 1 mA, preferably less than 10 µA, flow in the photonic component, thin metallic terminal contact layers are sufficient.

In an example, the first metallic connection contact layer is flat or finger-shaped or dot-shaped.

The term "flat" can refer to a terminal contact layer that completely covers, or at least covers to a large extent, e.g. 70%, the bottom side of the lowermost semiconductor layer of the III-V semiconductor photonic device, e.g. the absorption region or the semiconductor contact layer.

A dot-shaped terminal contact layer, on the other hand, covers only a small portion of the top side of the lowest semiconductor layer of the device, e.g. 20% or 10%. It is understood that the shape, e.g. the circumference, of the dot-shaped terminal contact layer can be arbitrary, e.g. circular, oval or polygonal, for example square.

A finger-shaped terminal contact layer only partially covers the bottom side of the lowermost semiconductor layer with individual elongated, strip-shaped or dot-shaped terminal contact layer sections and, if necessary, with a connecting transverse or only local terminal contact layer section, and is therefore the preferred embodiment for the semiconductor photonic device.

In an example, the first semiconductor contact region and the absorption region and/or a second semiconductor contact layer of the III-V semiconductor photonic device comprise a compound containing at least the elements GaAs or InGaAs, or consist of InGaAs or GaAs.

In an example, the stacked III-V semiconductor photonic device includes a further passivation layer, wherein the further passivation layer covers a top side of the III-V semiconductor passivation layer, a side surface of the III-V semiconductor passivation layer facing the absorption region, a top side of the absorption region adjacent to the side surface of the III-V semiconductor passivation layer, and an edge region of the top side of the first semiconductor contact region.

Preferably, the further passivation layer comprises $Si_3N_4$ and/or $SiO_2$ and/or $SiNO_x$ and/or polyimide or consists of $Si_3N_4$ and/or $SiO_2$ and/or $SiNO_x$ and/or polyimide.

In an example, the first semiconductor contact region is produced by implantation or diffusion of impurity atoms, e.g. Zn or Mg, into the absorption region. The depth of the first semiconductor contact region is at least 0.5 µm and at most 20 µm or at most 10 µm or at most 5 µm. The top side of the first semiconductor contact region preferably has a circular or oval or polygonal, e.g. rectangular or octagonal, circumference.

It is understood that the shape of the top side, i.e. the shape of the circumference, may be produced by a mask used for an implantation step.

In another further development, the stacked III-V semiconductor photonic device has a metamorphic buffer layer, wherein the metamorphic buffer layer is arranged below the bottom side of the absorption region and above the first metallic terminal contact layer, and has the first lattice constant on a top side facing the absorption region and a second lattice constant on a bottom side which differs from the first lattice constant.

Preferably, the metamorphic buffer layer has a thickness between 2 µm and 5 µm and a doping between $1·10^{17}$ to $1·10^{19}$ cm$^{-3}$. Preferably, the metamorphic buffer layer has at least three semiconductor layers and at most fifteen semiconductor layers. Preferably, the lattice constants of the semiconductor layers of the metamorphic buffer layer change from one semiconductor layer to the other.

The metamorphic buffer layer is used, for example, to epitaxially produce the absorption region on a substrate which has the second lattice constant. Alternatively, the buffer layer enables the formation of a semiconductor contact layer from a material which has the second lattice constant.

In a further development, the III-V semiconductor photonic device alternatively or additionally comprises a substrate layer, wherein the substrate layer is arranged below the bottom side of the absorption region and above the first metallic terminal contact layer, and has the first lattice constant or a second lattice constant which differs from the first lattice constant.

For example, it is possible that a growth substrate on which the layers of the semiconductor device were grown was not completely or only partially removed.

In a further development, the stacked III-V semiconductor photonic device alternatively or additionally comprises a semiconductor interlayer having a dopant concentration of $1·10^{14}$-$1·10^{16}$ cm$^{-3}$ and a layer thickness of at most 50 µm or at most 20 µm.

The semiconductor interlayer is arranged below the absorption region and above a highly doped semiconductor contact layer of the second conductivity type and is of the second conductivity type, or the semiconductor interlayer is formed between the first semiconductor contact region and the absorption region and is of the first conductivity type.

Preferably, the semiconductor interlayer is arranged between the very low doped absorption region and a highly doped semiconductor contact layer, i.e., the first semiconductor contact region or a second semiconductor contact layer, in order to reduce the series resistance, increase the breakdown resistance, and to achieve better thermal coupling.

In an example, the absorption region is of the second conductivity type and the first metallic terminal contact layer is integrally bonded to the bottom side of the absorption region or to a bottom side of a buffer layer arranged below the absorption region or to a bottom side of a substrate layer arranged below the absorption region.

As an alternative to the abovementioned example, the III-V semiconductor photonic device has a highly doped second semiconductor contact layer of the second conductivity type having a dopant concentration of at least $1·10^{17}$ cm$^{-3}$, a top side facing the absorption region and a bottom side, wherein the second semiconductor contact layer is arranged below the absorption region and the first metallic terminal contact layer is integrally bonded to the bottom side of the second semiconductor contact layer.

In a further development, the second semiconductor contact layer has a layer thickness of 0.5 µm-150 µm or of 0.5 µm-50 µm or of 0.5 µm and 10 µm or of 0.5 µm and 5 µm.

In a further development, the second semiconductor contact layer has the first lattice constant and the bottom side of the absorption region is preferably integrally bonded to the top side of the second semiconductor contact layer.

In an alternative further development, the semiconductor contact layer has a second lattice constant which differs from the first lattice constant, wherein between the semiconductor contact layer and the absorption region, a buffer layer with the first lattice constant is arranged on a top side facing the absorption region and said buffer layer with the second lattice constant is arranged on a bottom side facing the semiconductor contact layer.

In another embodiment, the semiconductor contact layer is formed as a substrate layer or as buffer layer. In other words, a single semiconductor layer has the function and properties of both the semiconductor contact layer and the substrate layer or the buffer layer or fulfills both functions.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
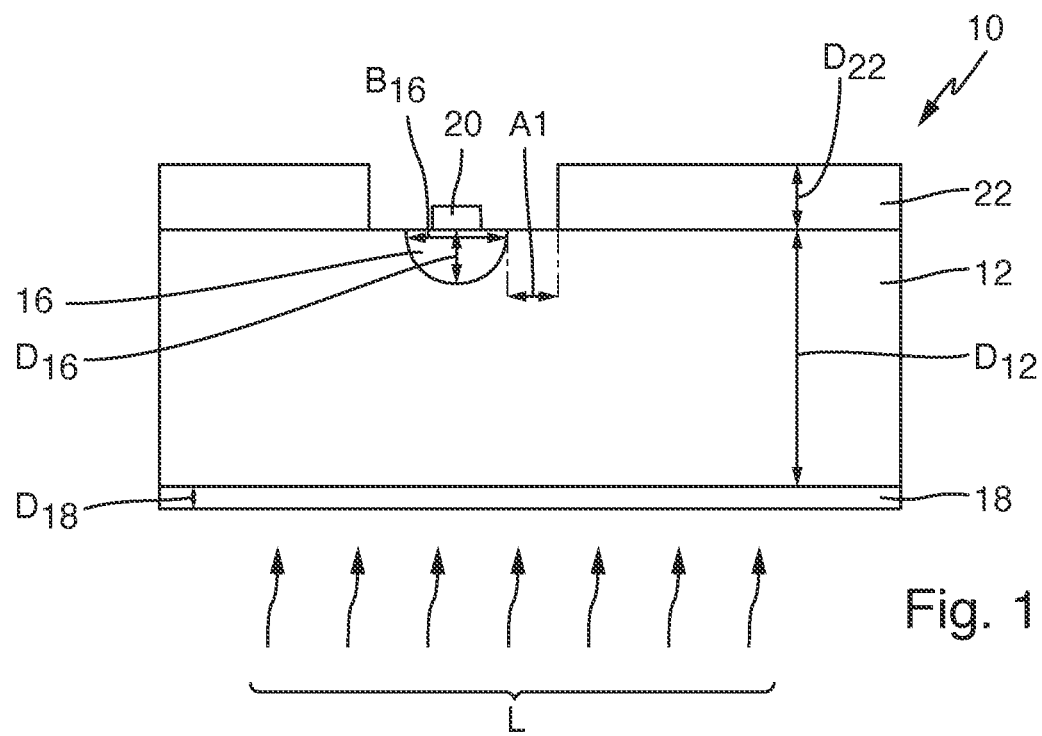
FIG. 1 shows a cross-sectional view of a first embodiment of a stacked III-V semiconductor photonic device.

The illustration of FIG. 1 shows a stacked III-V semiconductor photonic device 10 comprising an absorption region 12, a highly doped first semiconductor contact region 16, a first metallic terminal contact layer 18, a second metallic terminal contact layer 20, and a III-V semiconductor passivation layer 22.

The absorption region 12 is doped with dopants of a second conductivity type having a low to very low dopant concentration of $8 \cdot 10^{11}$-$5 \cdot 10^{14}$ cm$^{-3}$ and having a first lattice constant and a layer thickness D12 of at least 80 µm, e.g., 100 µm or 1000 µm.

On a bottom side of the absorption region 12, the first metallic terminal contact layer 18 follows in a integrally bonded manner as a thin planar metallic layer with a thickness D18 of at most 2 µm, e.g. 10 nm. Alternatively—not shown—the metallic terminal contact layer 18 is strip-shaped or finger-shaped or dot-shaped.

The highly doped first semiconductor contact region 16 comprises dopants of a first conductivity type having a dopant concentration of at least $5 \cdot 10^{18}$ cm$^{-3}$, and extends trough-shaped from the top side of the absorption region 12 with a width B16 and a depth D16 into the absorption region 12, so that a top side of the first semiconductor contact region 16 forms a common surface with the top side of the absorption region 12.

The second metallic terminal contact layer 20 is arranged on the top side of the first semiconductor contact region 16, wherein the metallic terminal contact layer 20 covers an at least approximately concentrically arranged portion of the top side of the second contact region 16. The second metallic terminal contact layer 20 is thus arranged in a projection perpendicular to the top side of the absorption region, concentric with the second contact region.

At a distance A1 from the top side of the highly doped first semiconductor contact region 16, the III-V semiconductor passivation layer 22 is arranged on the top side of the absorption region 12.

It is understood that the terms "top", "above", "bottom" and "below" serve only for the arrangement of the individual regions and layers relative to each other and do not indicate an absolute direction. Thus, the photonic device shown in FIG. 1 is designed, for example, to detect radiation L coming from below.

Figure 2:
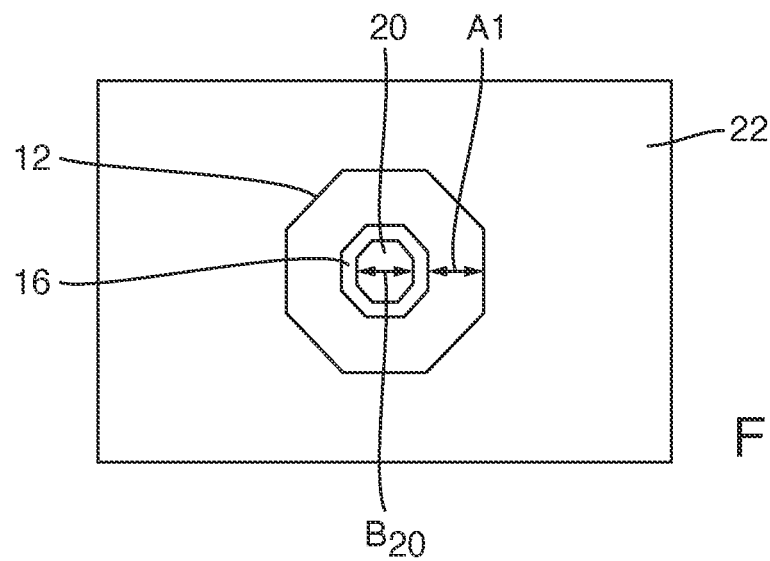
FIG. 2 shows a plan view of a top side of the first embodiment of the stacked III-V photonic semiconductor device.

The illustration of FIG. 2 shows a plan view of the first embodiment of the stacked III-V semiconductor photonic device.

The top side of the first semiconductor contact region 16 has an octagonal circumference and a diameter B16.

The second metallic terminal contact layer 20 also has an octagonal circumference and a diameter B20, smaller than the diameter B16, and is concentrically arranged to the top side of the first semiconductor contact region 16.

The top side of the first semiconductor contact region 16 is surrounded by an exposed portion of the top side of the absorption region 12, wherein the portion has a width A1 throughout. The remaining surface or top side of the absorption region 12 is completely covered by the III-V semiconductor passivation layer 22, i.e. the III-V semiconductor passivation layer 22 omits a portion of the absorption region 12 surface that comprises the first semiconductor contact region 16.

In embodiments not shown, the circumference of the second metallic terminal contact layer 20, the circumference of the top side of the first semiconductor contact region 16 and/or a circumference of the recess in the III-V semiconductor passivation layer 22 are circular, e.g., round or oval, or polygonal, e.g., square or rectangular.

It is understood that said circumferences need not all have the same shape. The only condition is for the circumference of the second metallic terminal contact layer 20 to be at a distance from the circumference of the top side of the first semiconductor contact region 16 at all points and for the circumference of the recess of the III-V passivation layer 22 to have at all points at least the first distance A1 to the circumference of the top side of the first semiconductor contact region 16.

Figure 3:
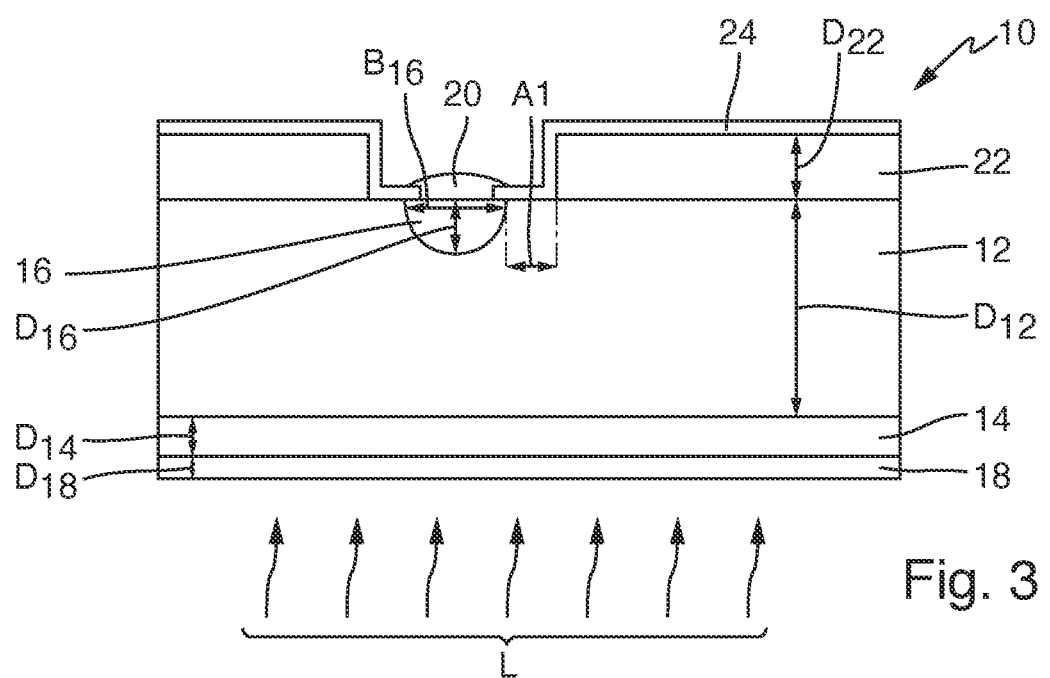
FIG. 3 shows a cross-sectional view of a second embodiment of the stacked III-V semiconductor photonic device.

The illustration of FIG. 3 shows a cross-sectional view of the stacked III-V semiconductor photonic device in a second embodiment.

A top side of the III-V semiconductor passivation layer 22 is covered by another passivation layer 24, e.g. a nitride layer and/or an oxide layer and/or a polyimide layer.

The further passivation layer 24 also extends over a portion of the top side of the absorption region, which surrounds the first semiconductor contact region 16 and is not covered by the first III-V semiconductor passivation layer 24, and over an edge region of the top side of the first semiconductor contact region 16 and a side surface of the III-V semiconductor passivation layer 22 oriented toward the first semiconductor contact region 16.

The second metallic terminal contact layer 20 covers the exposed central region of the top side of the first semiconductor contact region 16 and an adjoining region of the further passivation layer 24.

Between the absorption region 12 and the first metallic terminal contact layer 18, a second highly doped semiconductor contact layer 14 of the second conductivity type having a dopant concentration of at least $10^{17}$ cm$^{-3}$ and a layer thickness D14 of at most 20 µm or at most 5 µm or at most 2 µm or at most 0.5 µm and in any case greater than 10 nm is arranged.

The first metallic terminal contact layer 18 is formed in a integrally bonded manner as a thin planar metallic layer with a layer thickness D18 of at most 2 µm, e.g. 10 nm, on a bottom side of the semiconductor contact layer 14. Alternatively—not shown—the metallic terminal contact layer 18 is strip-shaped or finger-shaped or dot-shaped.

In the embodiment shown, the absorption region 12 is either of the first or the second conductivity type, wherein a p-n junction, in the first case, forms at the bottom side of the absorption region towards the second semiconductor contact layer 14 and, in the second case, forms at the junction between the absorption region 12 and the trough-shaped first semiconductor contact region. The first conductivity type is n and the second conductivity type is p, or vice versa.

Figure 4:
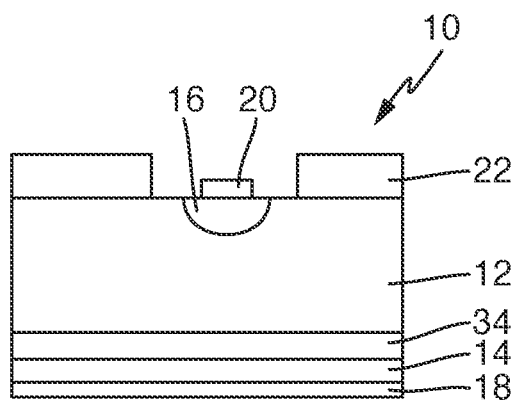
FIG. 4 shows a cross-sectional view of a third embodiment of a stacked III-V semiconductor photonic device.

FIG. 4 shows a sectional view of a third embodiment of the stacked III-V semiconductor photonic device. In the following, only the differences to the illustration of FIGS. 1 and 2 are explained.

The stacked III-V semiconductor photonic device 10 has, in addition to the second semiconductor contact layer 14, a semiconductor interlayer 34, wherein the semiconductor interlayer 34 is arranged between the semiconductor contact layer 14 and the absorption region 12, has a layer thickness of at most 50 µm, is of the second conductivity type and has a dopant concentration between $1·10^{14}$ cm$^{-3}$ and $1·10^{16}$ cm$^{-3}$.

Figure 5:
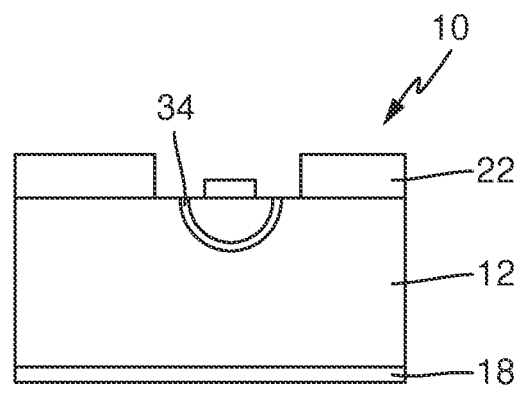
FIG. 5 shows a cross-sectional view of a fourth embodiment of a stacked III-V semiconductor photonic device.

FIG. 5 shows a sectional view of a fourth embodiment of the stacked III-V semiconductor photonic device. In the following, only the differences to the illustration of FIGS. 1 and 4 are explained.

The stacked III-V photonic device 10 does not have a highly doped semiconductor contact layer 14.

The semiconductor interlayer 34 is arranged between the absorption region 12 and the trough-shaped first semiconductor contact region 16 and has a layer thickness of at most 20 µm and is of the first conductivity type.

In an embodiment, not shown, the III-V semiconductor device has both the second semiconductor contact layer 14 and the semiconductor interlayer in FIG. 4 and the semiconductor interlayer 34 in FIG. 5.

Figure 6:
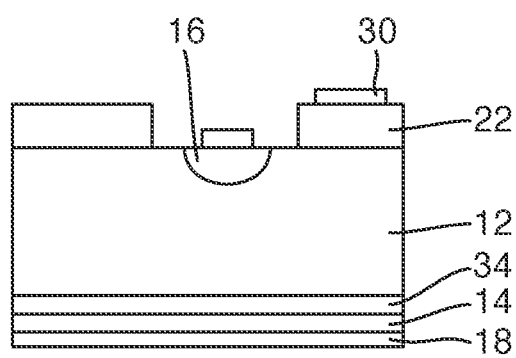
FIG. 6 shows a cross-sectional view of a fifth embodiment of stacked III-V semiconductor photonic device.

FIG. 6 shows a sectional view of a fifth embodiment of the stacked III-V semiconductor photonic device. In the following, only the differences to the illustration of FIG. 1 are explained.

On a top side of the III-V semiconductor passivation layer 22 of the III-V semiconductor photonic device 10, a third metallic terminal contact layer 30 formed at least in regions is arranged and integrally bonded to the top side of the III-V semiconductor passivation layer 22.

In addition, the III-V semiconductor passivation layer 22 is of the second conductivity type, the absorption region 12 as well as the first semiconductor contact region 12 are of the first conductivity type, and the second semiconductor contact layer 18 is of the second conductivity type.

Figure 7:
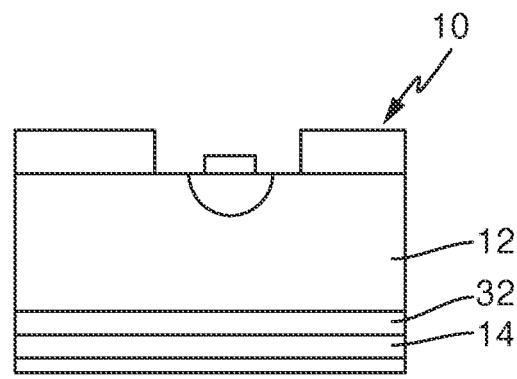
FIG. 7 shows a cross-sectional view of a sixth embodiment of a stacked III-V semiconductor photonic device.

FIG. 7 shows a sectional view of a sixth embodiment of the stacked III-V semiconductor photonic device. In the following, only the differences to the illustration of FIG. 1 are explained.

The III-V semiconductor photonic device 10 also has a buffer layer 32, wherein the buffer layer 32 has the first lattice constant on a top side and a second lattice constant on a bottom side.

The top side of the buffer layer 32 is integrally bonded to the bottom side of the absorption region 12, and the bottom side of the buffer layer 32 is integrally bonded to the top side of the highly doped semiconductor contact layer 14. The semiconductor contact layer 14 has the second lattice constant.

In an alternative embodiment, not shown, the III-V semiconductor photonic device has the buffer layer 32, but no semiconductor contact layer 14, so that the first metallic terminal contact layer 18 is integrally bonded to the bottom side of the buffer layer 32.

Also not shown are further developments in which the III-V semiconductor photonic device 10 has, instead of the buffer layer 32, a substrate layer with the first lattice constant or has, in addition to the buffer layer 32 and arranged below the buffer layer 32, a substrate layer with the second lattice constant.

It is understood that the two aforementioned embodiments can be realized both with the highly doped semiconductor contact layer and without the semiconductor contact layer 14.

It is noted that the III-V semiconductor photonic devices in the embodiments of FIGS. 3 to 8 may also have a further passivation layer 24 (not shown).

Figure 8:
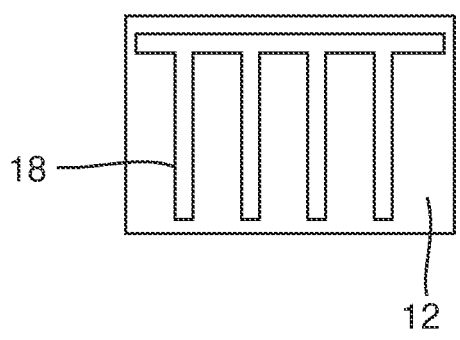
FIG. 8 shows a plan view of a bottom side of a seventh embodiment of the III-V semiconductor device.
Figure 9:
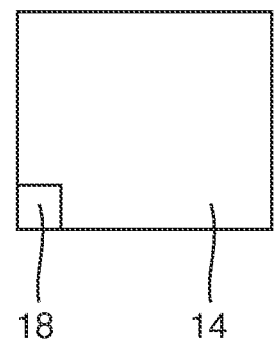
FIG. 9 shows a plan view of a bottom side of an eighth embodiment of the III-V semiconductor device.

In the illustration of FIGS. 8 and 9, plan views of a bottom side of the III-V semiconductor device are shown in a seventh and eighth embodiment, respectively. In the following, only the differences to the illustration of FIG. 1 are explained.

FIG. 8 shows a finger-shaped embodiment of the first metallic terminal contact layer 18, wherein the individual finger-shaped sections of the first terminal contact layer 18 in the illustrated embodiment run parallel to one another and are electrically conductively connected by means of a transversely running finger-shaped section.

FIG. 9 shows a dot-shaped configuration of the first metallic terminal contact layer 18 on the second semiconductor contact layer 14, wherein the first terminal contact layer 18 has a square circumference and is arranged in a corner of the bottom side of the absorption region 12.

Not shown are embodiments with a dot-shaped terminal contact layer 18 having a rectangular, polygonal, circular or oval circumference with any position on the bottom side of the absorption region.

Also not shown are embodiments in which the dot-shaped terminal contact layer 18 is arranged directly on the absorption region 12 or on another semiconductor interlayer 24.

It is also understood that the embodiments of the figures are compatible with each other.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A stacked III-V semiconductor photonic device, comprising:
 a second metallic terminal contact layer;
 a highly doped first semiconductor contact region of a first conductivity type having a dopant concentration of at least $5 \cdot 10^{18}$ cm$^{-3}$ and with a first lattice constant and a first energy band gap;
 an absorption region of a second conductivity type or of the first conductivity type having a dopant concentration of $8 \cdot 10^{11}$-$5 \cdot 10^{14}$ cm$^{-3}$ and a layer thickness between 80 μm and 2000 μm, wherein the absorption region has the first lattice constant;
 a first metallic terminal contact layer; and
 a III-V semiconductor passivation layer with the first lattice constant and a second energy bandgap which differs from the first energy bandgap,
 wherein the first semiconductor contact region is trough-shaped with a top side and a depth extending into the absorption region,
 wherein a bottom side of the second metallic terminal contact layer is integrally bonded to the top side of the first semiconductor contact region,
 wherein the first metallic terminal contact layer is arranged below a bottom side of the absorption region,
 wherein the III-V semiconductor passivation layer is of the first conductivity type or the second conductivity type and has a dopant concentration in a range between $1 \cdot 10^{14}$ and $1 \cdot 10^{18}$ cm$^{-3}$, and
 wherein the III-V semiconductor passivation layer is arranged on the top side of the absorption region at a first distance of at least 10 μm to the top side of the first semiconductor contact region and is integrally bonded to the top side of the absorption region.

2. The stacked III-V semiconductor photonic device according to claim 1, wherein the III-V semiconductor passivation layer has a layer thickness of 0.1 μm-10 μm.

3. The stacked III-V semiconductor photonic device according to claim 1, wherein the III-V semiconductor passivation layer comprises InGaP or AlGaAs or InGaAsP.

4. The stacked III-V semiconductor photonic device according to claim 1, wherein the first distance of the III-V semiconductor passivation layer to the semiconductor contact region is at least 50% of the layer thickness of the absorption region.

5. The stacked III-V semiconductor photonic device according to claim 1, wherein the III-V semiconductor passivation layer, in a projection perpendicular to the top side of the semiconductor contact region, completely surrounds the semiconductor contact region.

6. The stacked III-V semiconductor photonic device according to claim 1, further comprising:
 a third metallic terminal contact layer bonded to a top side of the semiconductor passivation layer,
 wherein the absorption region is of the first conductivity type and the III-V semiconductor passivation layer is of the second conductivity type.

7. The stacked III-V semiconductor photonic device according to claim 1, wherein the III-V semiconductor passivation layer is epitaxially produced on the absorption region and the absorption region is produced on a semiconductor contact layer or on a buffer layer or on a substrate layer.

8. The stacked III-V semiconductor photonic device according to claim 1, wherein the first metallic terminal contact layer has a layer thickness of 10 nm-1 μm.

9. The stacked III-V semiconductor photonic device according to claim 1, wherein the first metallic terminal contact layer is flat or finger-shaped or dot-shaped.

10. The stacked III-V semiconductor photonic device according to claim 1, wherein the first semiconductor contact region and the absorption region and/or a second semiconductor contact layer comprises GaAs.

11. The stacked III-V semiconductor photonic device according to claim 1, further comprising:
 a further passivation layer covering a top side of the III-V semiconductor passivation layer, a side surface of the III-V semiconductor passivation layer facing the absorption region, a top side of the absorption region adjacent to the side surface of the III-V semiconductor passivation layer, and an edge region of the top side of the first semiconductor contact region.

12. The stacked III-V semiconductor photonic device according to claim 11, wherein the further passivation layer comprises $Si_3N_4$ and/or $SiO_2$ and/or $SiNO_x$ and/or polyimide.

13. The stacked III-V semiconductor photonic device according to claim 1, wherein the first semiconductor contact region is produced by implantation or diffusion of impurity atoms into the absorption region.

14. The stacked III-V semiconductor photonic device according to claim 1, wherein the depth of the first semiconductor contact region is at least 0.5 μm and at most 20 μm.

15. The stacked III-V semiconductor photonic device according to claim 1, wherein the top side of the first semiconductor contact region has a circular or an oval or a polygonal circumference.

16. The stacked III-V semiconductor photonic device according to claim 1,
 wherein the first conductivity type is n and the second conductivity type is p or
 wherein the first conductivity type is p and the second conductivity type is n.

17. The stacked III-V semiconductor photonic device according to claim 1, further comprising:
 a buffer layer arranged below the bottom side of said absorption region and above the first metallic terminal contact layer,
 wherein the buffer layer, on a top side facing the absorption region, has the first lattice constant and, on a bottom side, has a second lattice constant which differs from the first lattice constant.

18. The stacked III-V semiconductor photonic device according to claim 1, further comprising:
 a substrate layer arranged below the bottom side of the absorption region and above the first metallic terminal contact layer and has the first lattice constant or a second lattice constant which differs from the first lattice constant.

19. The stacked III-V semiconductor photonic device according to claim 1, further comprising:
 a semiconductor interlayer having a dopant concentration of $1 \cdot 10^{14}$ cm$^{-3}$-$1 \cdot 10^{16}$ cm$^{-3}$ and having a layer thickness of at most 50 μm or at most 20 μm,
 wherein the semiconductor interlayer is arranged below the absorption region and above a highly doped semiconductor contact layer of the second conductivity type and is of the second conductivity type and/or the semiconductor interlayer is formed between the first semiconductor contact region and the absorption region and is of the first conductivity type.

20. The stacked III-V semiconductor photonic device according to claim 1, further comprising:

a highly doped second semiconductor contact layer of the second conductivity type having a dopant concentration of at least $1 \cdot 10^{17}$ cm$^{-3}$, a top side facing the absorption region and a bottom side, wherein the second semiconductor contact layer is arranged below the absorption region and the first metallic terminal contact layer is integrally bonded to the bottom side of the second semiconductor contact layer.

21. The stacked III-V semiconductor photonic device according to claim 20, wherein the second semiconductor contact layer has a layer thickness of 0.5 µm-150 µm.

22. The stacked III-V semiconductor photonic device according to claim 20, wherein the second semiconductor contact layer has the first lattice constant.

23. The stacked III-V semiconductor photonic device according to claim 21, wherein the bottom side of the absorption region is integrally bonded to the top side of the semiconductor contact layer.

24. The stacked III-V semiconductor photonic device according to claim 21, wherein the semiconductor contact layer has a second lattice constant which differs from the first lattice constant, and wherein between the semiconductor contact layer and the absorption region a buffer layer is arranged with the first lattice constant at a top side facing the absorption region and with the second lattice constant at a bottom side facing the semiconductor contact layer.

25. The stacked III-V semiconductor photonic device according to claim 20, wherein the semiconductor contact layer is formed as a substrate layer or a buffer layer.

* * * * *